United States Patent
Zhou et al.

(10) Patent No.: US 8,980,754 B2
(45) Date of Patent: Mar. 17, 2015

(54) METHOD OF REMOVING A PHOTORESIST FROM A LOW-K DIELECTRIC FILM

(75) Inventors: Yifeng Zhou, Fremont, CA (US); Srinivas D. Nemani, Sunnyvale, CA (US); Khoi Doan, San Jose, CA (US); Jeremiah T. P. Pender, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 876 days.

(21) Appl. No.: 13/187,357

(22) Filed: Jul. 20, 2011

(65) Prior Publication Data

US 2013/0023123 A1    Jan. 24, 2013

(51) Int. Cl.
| | |
|---|---|
| *H01L 21/302* | (2006.01) |
| *H01L 21/311* | (2006.01) |
| *H01L 21/3105* | (2006.01) |
| *H01L 21/768* | (2006.01) |
| *H01L 21/02* | (2006.01) |

(52) U.S. Cl.
CPC ...... *H01L 21/31138* (2013.01); *H01L 21/3105* (2013.01); *H01L 21/76814* (2013.01); *H01L 21/76826* (2013.01); *H01L 21/02126* (2013.01); *H01L 21/02203* (2013.01); *H01L 2221/1063* (2013.01)
USPC ............. 438/702; 438/695; 438/700

(58) Field of Classification Search
CPC ................... H01L 21/0273; H01L 21/31138; H01L 21/3105; H01L 21/76814; H01L 21/76826; H01L 21/02126; H01L 2221/1063
USPC .......................................... 438/702, 695, 700
See application file for complete search history.

(56) References Cited

U.S. PATENT DOCUMENTS

2009/0017563 A1* 1/2009 Jiang et al. .............. 438/4

* cited by examiner

*Primary Examiner* — Ha Tran T Nguyen
*Assistant Examiner* — Suberr Chi
(74) *Attorney, Agent, or Firm* — Blakely Sokoloff Taylor Zafman LLP

(57) ABSTRACT

Methods of removing photoresists from low-k dielectric films are described. For example, a method includes forming and patterning a photoresist layer above a low-k dielectric layer, the low-k dielectric layer disposed above a substrate. Trenches are formed in the exposed portions of the low-k dielectric layer. A plurality of process cycles is performed to remove the photoresist layer. Each process cycle includes forming a silicon source layer on surfaces of the trenches of the low-k dielectric layer, and exposing the photoresist layer to an oxygen source to form an Si—O-containing layer on the surfaces of the trenches of the low-k dielectric layer and to remove at least a portion of the photoresist layer.

20 Claims, 8 Drawing Sheets

METHOD OF REMOVING A PHOTORESIST FROM A LOW-K DIELECTRIC FILM

BACKGROUND

1) Field

Embodiments of the present invention pertain to the field of semiconductor processing and, in particular, to methods of removing photoresists from low-k dielectric films.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

SUMMARY

Embodiments of the present invention include methods of removing photoresists from low-k dielectric films.

In an embodiment, a method includes forming and patterning a photoresist layer above a low-k dielectric layer, the low-k dielectric layer disposed above a substrate. Trenches are formed in the exposed portions of the low-k dielectric layer. A plurality of process cycles is performed to remove the photoresist layer. Each process cycle includes forming a silicon source layer on surfaces of the trenches of the low-k dielectric layer, and exposing the photoresist layer to an oxygen source to form an Si—O-containing layer on the surfaces of the trenches of the low-k dielectric layer and to remove at least a portion of the photoresist layer.

In another embodiment, a method includes forming and patterning a photoresist layer above a low-k dielectric layer, the low-k dielectric layer disposed above a substrate. Trenches are formed in exposed portions of the low-k dielectric layer. Surfaces of the trenches of the low-k dielectric layer are hydrolyzed. A silicon source is reacted with the hydrolyzed surfaces of the trenches of the low-k dielectric layer. The photoresist layer is exposed to an oxygen source to remove the photoresist layer.

In another embodiment, a method includes forming and patterning a photoresist layer above a low-k dielectric layer, the low-k dielectric layer disposed above a substrate. Trenches are formed in exposed portions of the low-k dielectric layer. A plurality of process cycles is performed to remove the photoresist layer. Each process cycle includes hydrolyzing surfaces of the trenches of the low-k dielectric layer, reacting a silicon source with the hydrolyzed surfaces of the trenches of the low-k dielectric layer, and exposing the photoresist layer to an oxygen source to remove at least a portion of the photoresist layer.

BRIEF DESCRIPTION OF THE DRAWINGS

FIGS. 4D' and 4E' illustrate cross-sectional views representing various operations in another method of patterning a low-k dielectric film, in accordance with an embodiment of the present invention.

DETAILED DESCRIPTION

Methods of removing photoresists from low-k dielectric films are described. In the following description, numerous specific details are set forth, such as chemical compositions of silicon oxide precursor sources, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

Porous low-k dielectric materials, e.g. porous SiCOH, are typically sensitive to plasma ashing. The sensitivity may arise from the chemical resemblance to an organic mask. As such, one key to reducing low-k dielectric ashing damage may be to improve selectivity between an organic mask and low-k dielectric material. The sensitivity may also arise from a high porosity which allows ashing chemistry to diffuse deep into low-k dielectric film.

In accordance with one or more embodiments of the present invention, a cyclic passivation and ashing approach is used to reduce ashing damage typically associated with removal of a photoresist layer from an exposed or partially exposed low-k dielectric layer. In one such embodiment, a process scheme includes alternating steps of passivation and ashing. During each of the passivation operations, a silicon-containing passivation agent is used to selectively react with an ultra low-k (ULK) material to form a thin layer of silicon-containing film on exposed portions of the ULK material. During each of the ashing operations, the thin layer of silicon-containing film acts to protect against an ashing plasma, e.g., which may be used to etch a photoresist layer. The protecting reduces damage that the ashing plasma would otherwise cause to the ULK material. The protecting nature of the passivating layer may be considered to be in situ, in the sense that the film may form Si—O linkages upon exposure to the ashing plasma. The Si—O linkages may provide selectivity against the ashing plasma.

The passivation layer may be removed or at least somewhat compromised during the ashing by chemical reaction or physical sputtering. Accordingly, in one embodiment, cyclic passivation/ashing operations are used. Such cyclic passivation/ashing operations may be repeated until all organic mask material (e.g., an overlying photoresist layer) is removed. Any remaining portions of the passivation layer may be removed, e.g., in one embodiment, by a diluted hydrofluoric acid (HF) clean.

Figure 1:
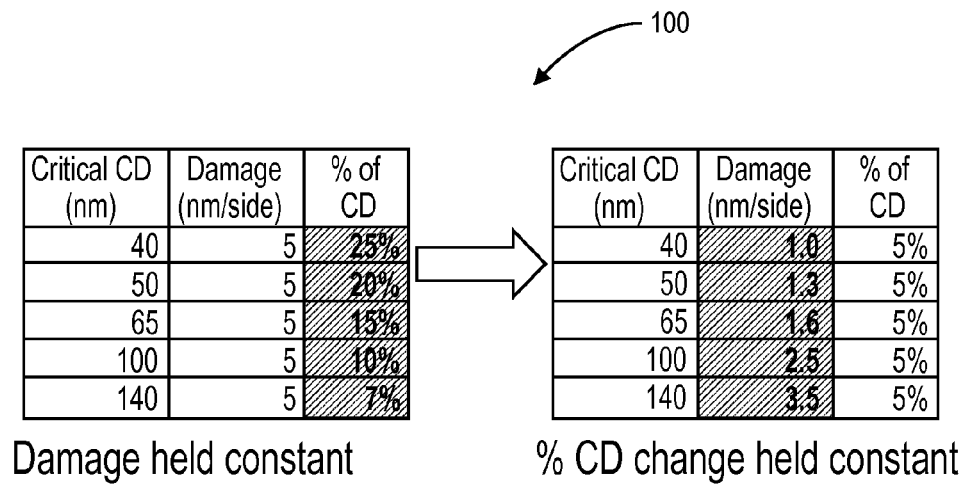
FIG. 1 is a plot of low-k ashing damage as a portion of critical dimension (CD).

Low-k dielectric ashing damage as a portion of critical dimension (CD) may need to be kept constant to maintain a same integrated k value as the CD decreases. Therefore, the absolute damage amount needs to decrease as technology progresses. FIG. 1 is a plot 100 of low-k ashing damage as a portion of critical dimension (CD). Referring to plot 100, critical dimension (CD: in nanometers, and representative of a given technology node) if compared against ashing damage per feature side (in nanometers) along with a corresponding percentage of CD. A review of plot 100 shows that ash optimization achieved for one technology is likely not sufficient for N+1 or N+2 technology nodes.

In an aspect of the present invention, a silicon source is first formed on a low-k dielectric film and then converted to an Si—O-containing film. In an embodiment, a photoresist layer disposed on or above the low-k dielectric film is removed by a plasma process that would otherwise damage the low-k dielectric film. The Si—O containing film protects the low-k dielectric film during the plasma process. As an example of a portion of the process, FIG. 2 illustrates a molecular schematic of the formation of an Si—O-containing protecting film on the surface of a low-k dielectric layer, in accordance with an embodiment of the present invention.

Figure 2:
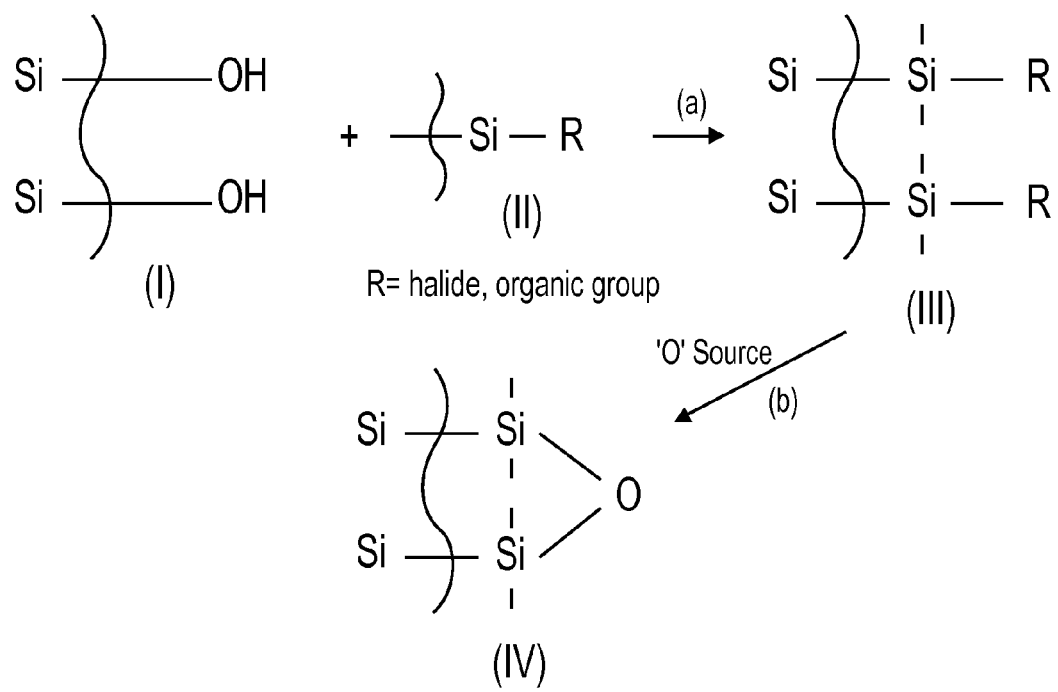
FIG. 2 illustrates a molecular schematic of the formation of an Si—O-containing protecting film on the surface of a low-k dielectric layer, in accordance with an embodiment of the present invention.

Referring to FIG. 2, an exposed, hydrolyzed portion (I) of a low-k dielectric film is provided. Although low-k film typically do not include Si—OH bonds at their surface upon fabrication, hydrolysis of the outer-most layer or layers of low-k films may be come hydrolyzed during processing of the film. For example, in one embodiment, Si—OH bonds are formed at the surface of a low-k film (as depicted for (I)) upon etching of a photoresist layer and a portion of the low-k dielectric film. In a specific such example, a dry etch releases fragments suitable for forming Si—OH linkages, effectively "hydrolyzing" the outer surface of the low-k dielectric film.

Referring to reaction (a) of FIG. 2, a silicon-containing passivation agent (II) is reacted with the hydrolyzed surface of (I) to form a low-k-containing film with a bonded passivating layer of Si—R linkages (e.g., R=halide, or organic group). In one such embodiment, the Si—R linkages are covalently bonded to Si atoms of the low-k film, as depicted for (III). Referring to reaction (b) of FIG. 2, an oxygen source, such as an oxygen-containing plasma (ashing plasma), is introduced to cleave the R groups of the Si—R linkages of (III), forming (IV) with outer-most Si—O linkages. The Si—O linkages may be used to protect an underlying, and possibly bonded, low-k film from the very ashing plasma used to form the Si—O linkages. Meanwhile, an exposed photoresist may be removed with the ashing plasma.

Figure 3:
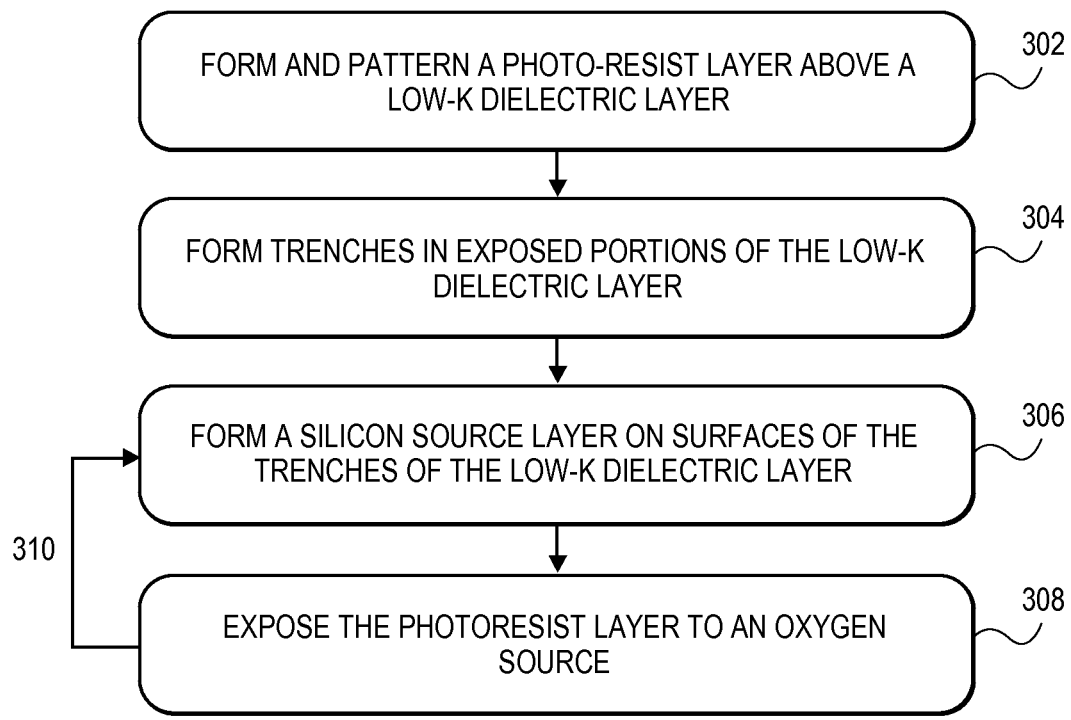
FIG. 3 is a Flowchart representing operations in a method of patterning a low-k dielectric film, in accordance with an embodiment of the present invention.

In an aspect of the present invention, a photoresist layer may be removed in the presence of an exposed low-k dielectric film. For example, FIG. 3 is a Flowchart 300 representing operations in a method of patterning a low-k dielectric film, in accordance with an embodiment of the present invention. FIGS. 4A-4G illustrate cross-sectional views representing operations in a method of patterning a low-k dielectric film, in accordance with an embodiment of the present invention.

Figure 4A:
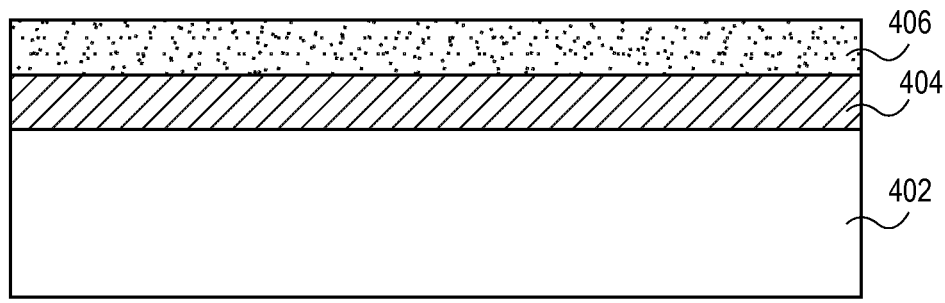
FIGS. 4A-4H illustrate cross-sectional views representing various operations in a method of patterning a low-k dielectric film, corresponding to the Flowchart of FIG. 3, in accordance with an embodiment of the present invention.
Figure 4B:
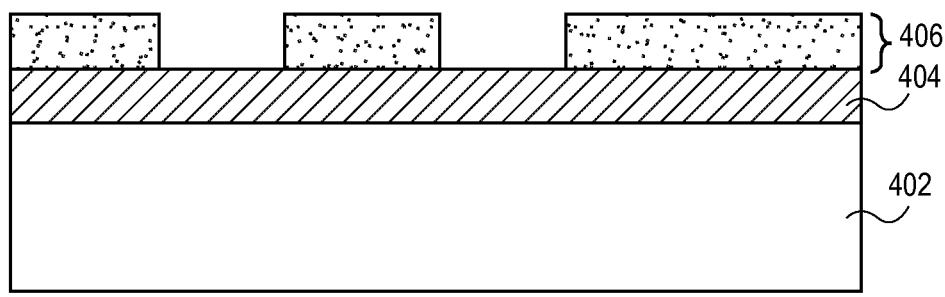

Referring to operation 302 of Flowchart 300 and corresponding FIGS. 4A and 4B, a method of patterning a low-k dielectric film includes forming (FIG. 4A) and patterning (FIG. 4B) a photoresist layer 406 above a low-k dielectric layer 404, the low-k dielectric layer 404 disposed above a substrate 402. In an embodiment, the photoresist layer 406 is formed directly on the low-k dielectric layer 404, as depicted in FIGS. 4A and 4B. In another embodiment (not shown), the photoresist layer 406 is formed above a hardmask layer disposed above the low-k dielectric layer 404. In a specific such embodiment, the hardmask layer is a layer of dielectric material such as, but not limited to, a layer of silicon dioxide, a layer of silicon nitride, a layer of silicon oxynitride, or a combination thereof.

The photoresist layer 406 may be composed of a material suitable for use in a lithographic process. That is, in an embodiment, the photoresist layer 406 is exposed to a light source and subsequently developed. In one embodiment, the portions of the photoresist layer 406 to be exposed to the light source will be removed upon developing the photoresist layer 406, e.g., the photoresist layer 406 is composed of a positive photoresist material. In a specific embodiment, the photoresist layer 406 is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer 406 to be exposed to the light source will be retained upon developing the photoresist layer 406, e.g., the photoresist layer 406 is composed of a negative photoresist material. In a specific embodiment, the photoresist layer 406 is composed of a negative photoresist material such as, but not limited to, poly-cis-isoprene and poly-vinyl-cinnamate.

In an embodiment, the low-k dielectric layer 404 has a permittivity less than that of silicon dioxide, e.g., less than approximately 3.9. In one embodiment, the low-k dielectric layer 404 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 404 is a porous SiCOH layer having a dielectric constant of less than 2.7.

Substrate 402 may be composed of a material suitable to withstand a fabrication process and upon which semiconductor processing layers may suitably reside. In accordance with an embodiment of the present invention, substrate 402 is composed of a group IV-based material such as, but not limited to, crystalline silicon, germanium or silicon/germanium. In a specific embodiment, providing substrate 402 includes providing a monocrystalline silicon substrate. In a particular embodiment, the monocrystalline silicon substrate is doped with impurity atoms. In another embodiment, substrate 402 is composed of a material. In an embodiment, a plurality of semiconductor devices resides on substrate 402, below low-k dielectric layer 404.

Figure 4C:
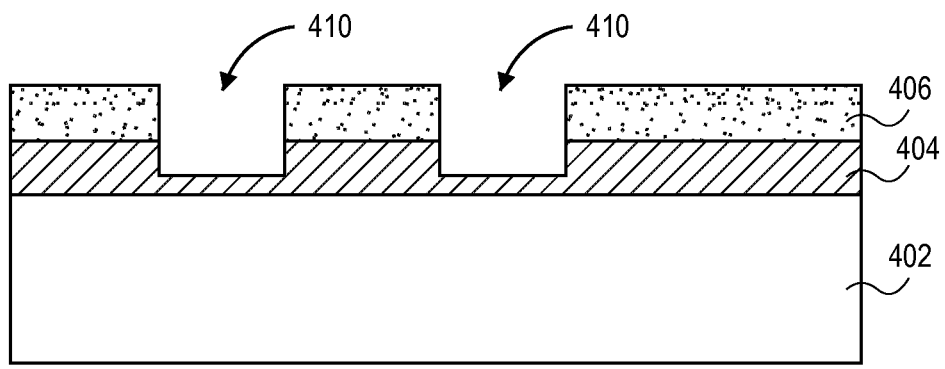

Referring to operation 304 of Flowchart 300 and corresponding FIG. 4C, the method of patterning the low-k dielectric film also includes forming trenches 410 in exposed portions of the low-k dielectric layer 404. In accordance with an embodiment of the present invention, forming the trenches 410 in exposed portions of the low-k dielectric layer 404 includes forming the trenches 410 into, but not entirely through, the low-k dielectric layer 404, as depicted in FIG. 4C. In another embodiment (not depicted), forming the trenches 410 in exposed portions of the low-k dielectric layer 404 includes forming the trenches 410 entirely through the low-k dielectric layer 404. In an embodiment, the trenches 410 are formed by treating the low-k dielectric layer 404 with a plasma etch process. During the plasma etch process, exposed surfaces of the low-k dielectric layer 404 may become hydrolyzed, as described in association with FIG. 2.

Referring to operations 306 and 308 of Flowchart 300 and corresponding FIGS. 4D-4H, one or more process cycles 310 are used to remove the photoresist layer 406.

Figure 4D:
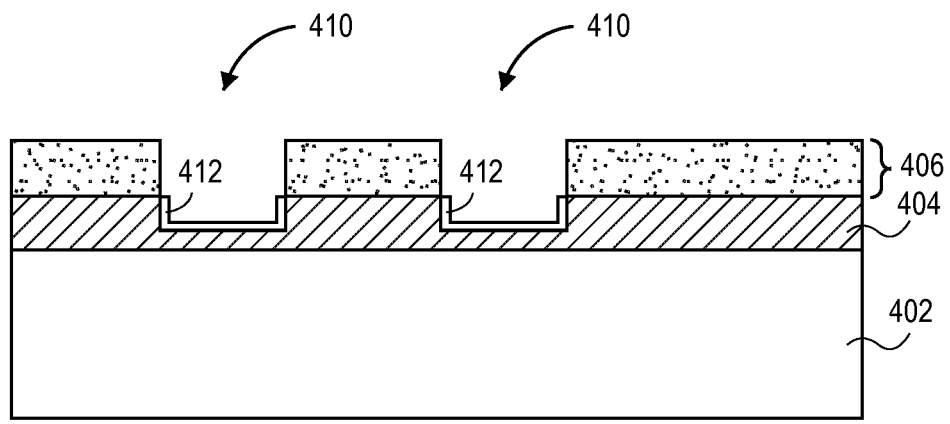

Specifically, referring to operation 306 and FIG. 4D, a silicon source layer 412 is formed on the surfaces of the trenches 410 of the low-k dielectric layer 404. In an embodiment, the silicon source layer 412 is formed from molecular species that react with a hydrolyzed portion of the low-k dielectric layer 404. In one embodiment, the silicon source layer 412 forms a covalent bond between the silicon source layer 412 and the exposed portions of the low-k dielectric layer 404, as described in association with FIG. 2. In one embodiment, the silicon source layer is formed from a species such as, but not limited to, silicon tetrachloride ($SiCl_4$), dimethylsilane (($CH_3)_2SiH_2$), trimethylsilane (($CH_3)_3SiH$), N-(trimethylsilyl)dimethylamine (($CH_3)_3SiN(CH_2)_2$), or 1,1,1,3,3,3-hexamethyldisilazane (HMDS). In one embodiment, the substrate 402 is situated on a hot plate during the forming of the silicon source layer 412.

Figure 4E:
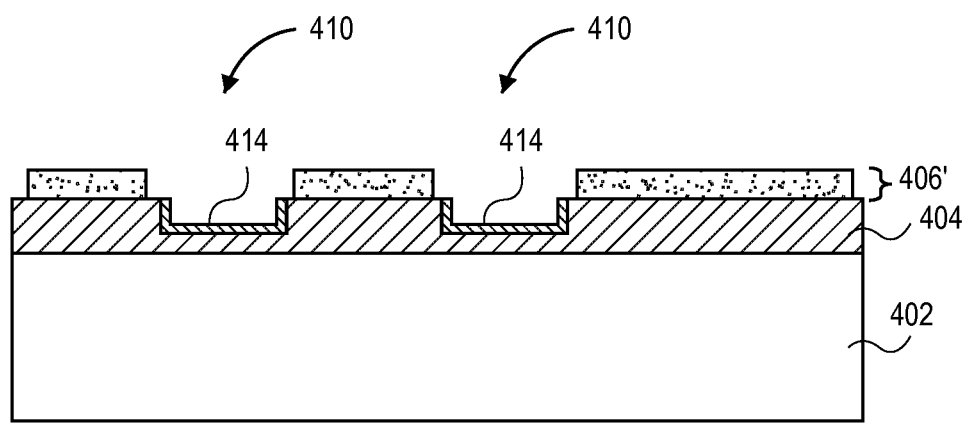

Referring to operation 308 and FIG. 4E, process cycle 410 further includes exposing the photoresist layer 406 to an oxygen source. In an embodiment, exposure to the oxygen source forms an Si—O-containing layer 414 on the surfaces of the trenches 410 of the low-k dielectric layer 404 and removes at least a portion of the photoresist layer 406. For example, in one embodiment, the silicon source layer 412 is converted to the Si—O-containing layer 414, as described in association with FIG. 2. In the same process, the photoresist layer 406 is partially removed to form residual photoresist layer 406', as depicted in FIG. 4E. In an embodiment, the Si—O-containing layer 414 protects the low-k dielectric layer 404 during removal of the portion of the photoresist layer 406. It is to be understood that, in the absence of the S—O-containing layer 414, the low-k dielectric layer 404 may otherwise be damaged by the process used to remove the portion of the photoresist layer 406. In one embodiment, the Si—O-containing layer 414 has a thickness less than approximately 1 nanometer.

In accordance with an embodiment of the present invention, exposing the photoresist layer 406 to an oxygen source includes treating with a plasma. In one embodiment, the plasma is based on an oxygen radical source. The oxygen radical source is a molecule with a dissociation product composed of an oxygen radical. In a specific such embodiment, the oxygen radical source is a source such as, but not limited to, oxygen ($O_2$), ozone ($O_3$), carbon dioxide ($CO_2$), or water ($H_2O$).

In an embodiment, although not depicted, subsequent to the partial removal of the photoresist layer 406 to form residual photoresist layer 406', the Si—O-containing layer 414 is removed. In one such embodiment, the Si—O-containing layer 414 is removed by a dry etch process. In another embodiment, a wet etch solution including hydrofluoric acid (HF) is used to remove the Si—O-containing layer 414. However, it is to be understood that no such additional treatment may be needed. For example, in one embodiment, the Si—O-containing layer 414 is removed during the ashing by chemical reaction or physical sputtering.

The operations 306 and 308 of cycle 310 may be repeated as required to completely remove the photoresist layer 406. For example, in one embodiment, cycle 310 of Flowchart 300 is performed between 2 and 10 times. As an exemplary embodiment, FIGS. 4F and 4G illustrate an embodiment in which, in conjunction with FIGS. 4D and 4E, a total of two cycles are performed to totally remove the photoresist layer 406.

Figure 4F:
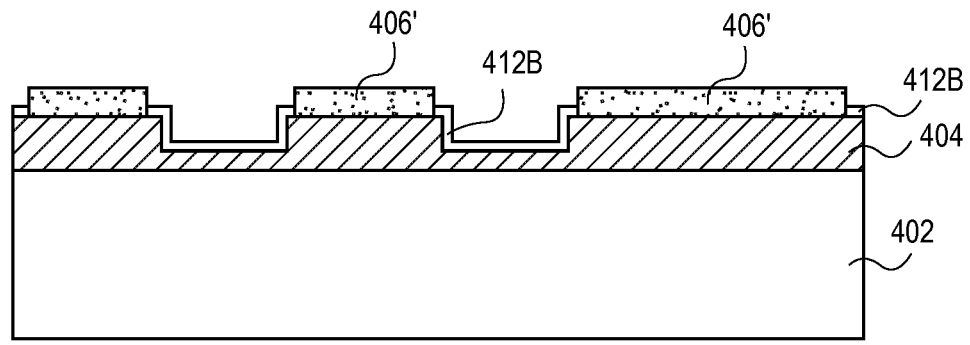

Referring to FIG. 4F, a second silicon source layer 412B is formed on the surfaces of the trenches 410 of the low-k dielectric layer 404, as well as on any top surfaces now exposed by the partial removal of photoresist layer 406. In an embodiment, the second silicon source layer 412B is formed from molecular species that react with a hydrolyzed portion of the low-k dielectric layer 404. In one embodiment, the second silicon source layer 412B forms a covalent bond between the second silicon source layer 412B and the exposed portions of the low-k dielectric layer 404, as described in association with FIG. 2. In one embodiment, the second silicon source layer 412B is composed of the same species as the silicon source layer 412. In an embodiment, the second silicon source layer 412B is formed from a species such as, but not limited to, silicon tetrachloride ($SiCl_4$), dimethylsilane (($CH_3)_2SiH_2$), trimethylsilane (($CH_3)_3SiH$), N-(trimethylsilyl)dimethylamine (($CH_3)_3SiN(CH_2)_2$), or 1,1,1,3,3,3-hexamethyldisilazane (HMDS).

Figure 4G:
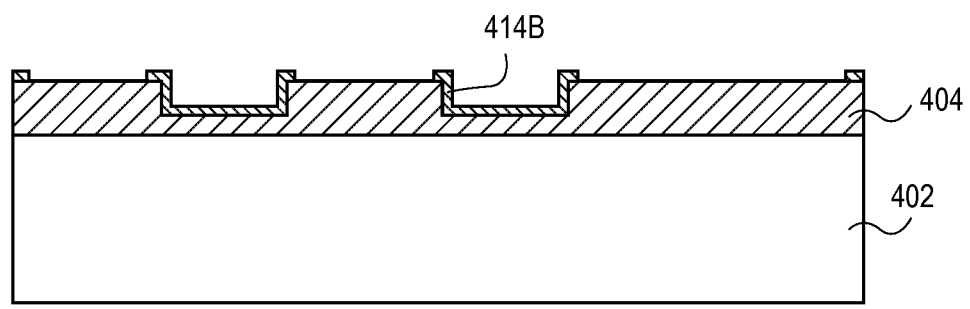

Referring to FIG. 4G, the residual photoresist layer 406' of FIGS. 4E and 4F is exposed to an oxygen source. In an embodiment, exposure to the oxygen source forms a second Si—O-containing layer 414B on the surfaces of the trenches 410 of, and on portions of the top surface of, the low-k dielectric layer 404 and completely removes the residual photoresist layer 406'. For example, in one embodiment, the second silicon source layer 412B is converted to the second Si—O-containing layer 414B, as described in association with FIG. 2. In the same process, the residual photoresist layer 406' is completely removed, as depicted in FIG. 4G.

In an embodiment, exposing the residual photoresist layer 406' to the oxygen source includes treating with a plasma. In one embodiment, the plasma is based on an oxygen radical source. The oxygen radical source is a molecule with a dissociation product composed of an oxygen radical. In a specific such embodiment, the oxygen radical source is a source such as, but not limited to, oxygen ($O_2$), ozone ($O_3$), carbon dioxide ($CO_2$), or water ($H_2O$). In an embodiment, exposing the residual photoresist layer 406' to the oxygen source includes using the same process previously used to partially remove the photoresist layer 406 to form the residual photoresist layer 406'.

Figure 4H:
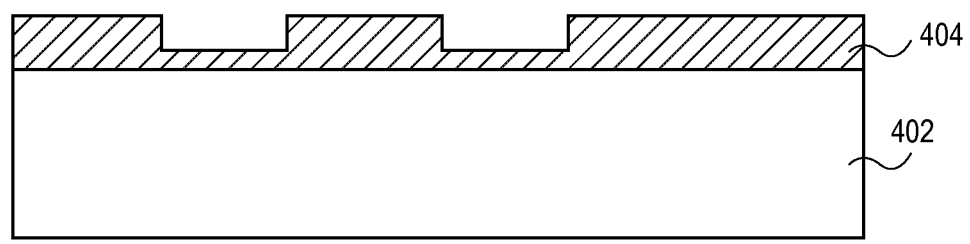
Figure 4D:
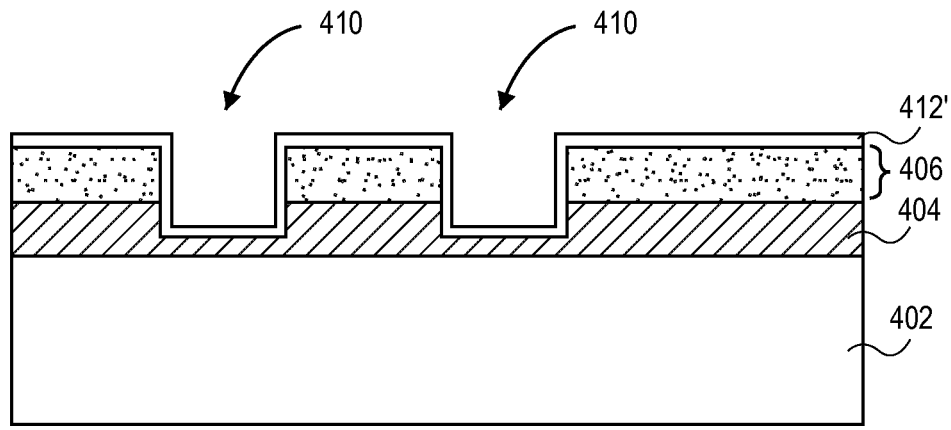
Figure 4E:
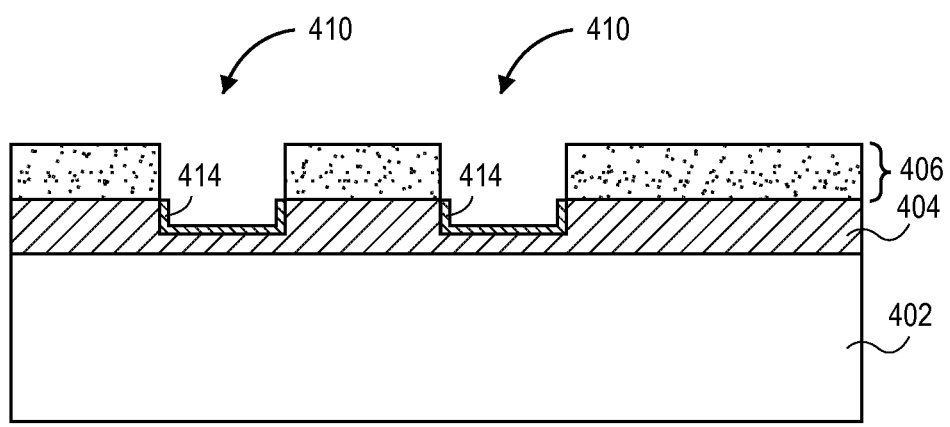

In an embodiment, referring to FIG. 4H, subsequent to the removal of the residual photoresist layer 406', the second Si—O-containing layer 414B is removed. In one such embodiment, the second Si—O-containing layer 414B is removed by a dry etch process. In another embodiment, a wet etch solution including hydrofluoric acid (HF) is used to remove the second Si—O-containing layer 414B. However, it is to be understood that no such additional treatment may be needed. For example, in one embodiment, the second Si—O-containing layer 414B is removed during the ashing by chemical reaction or physical sputtering.

In accordance with an embodiment of the present invention, FIGS. 4D' and 4E' illustrate either an alternative to, or a more specific example of, the embodiment described in association with FIGS. 4D and 4E. Specifically, it is to be understood that, with respect to FIG. 4D, the silicon source layer 412 may not be initially formed selectively on the low-k layer, as is depicted in FIG. 4D. Instead, referring to FIG. 4D', a silicon source layer 412' is formed not only on the surfaces of the trenches 410 of the low-k dielectric layer 404, but also on the photoresist layer 406. In one such embodiment, the silicon source layer 412' is formed from molecular species that react with a hydrolyzed portion of the low-k dielectric layer 404, but do not react with the photoresist layer 406. For example, the silicon source layer 412' may form a covalent bond between the silicon source layer 412' and the exposed portions of the low-k dielectric layer 404, as described in association with FIG. 2, but does not form a covalent bond with the photoresist layer 406. Thus, although the deposition of the silicon source layer 412' may not be selective, in one embodiment, reaction of the silicon source layer 412' with the low-k dielectric layer 404 versus no reaction with the photoresist layer 406 is selective.

Referring to FIG. 4E', possibly before any of photoresist layer 406 is removed, the Si—O-containing layer 414 is formed on the surfaces of the trenches 410 of the low-k dielectric layer 404. Exposure to the oxygen source then removes at least a portion of the photoresist layer 406. Thus, in one embodiment, the formation of the Si—O-containing layer 414 occurs early enough in the ashing process that a minimal amount of photoresist layer 406 is removed by the time the low-k dielectric layer 404 is passivated. Then, in an embodiment, the Si—O-containing layer 414 protects the low-k dielectric layer 404 during removal of the portion of the photoresist layer 406. It is to be understood that, in the absence of the Si—O-containing layer 414, the low-k dielectric layer 404 may otherwise be damaged by the process used to remove the portion of the photoresist layer 406.

In an embodiment, one or more of the above processes is performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Centura® Producer Etch chamber with a twin chamber design, also available from Applied Materials of Sunnyvale, Calif., USA. For example, the latter may include a high throughput density with the twin chambers and a two-FOUP, dual robot factory interface. Each twin chamber may operate in single- or dual-wafer mode. Etch rate, etch rate uniformity, and resist selectivity can be tuned by adjusting a gap between electrodes, enabling process optimization for different applications.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 5:
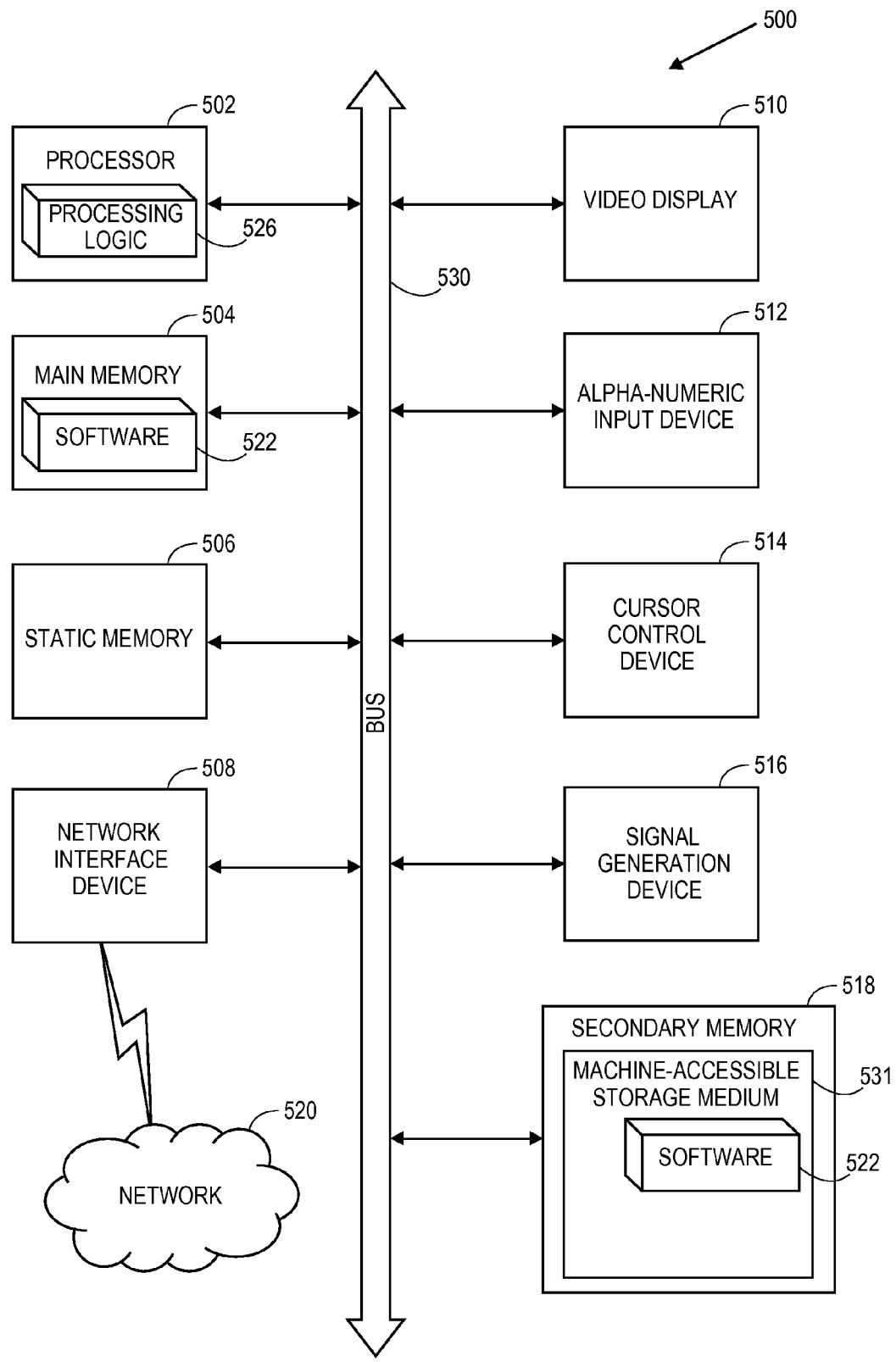
FIG. 5 illustrates a block diagram of an exemplary computer system, in accordance with an embodiment of the present invention.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of performing photoresist removal from a low-k dielectric layer. The method includes forming and patterning a photoresist layer above a low-k dielectric layer, the low-k dielectric layer disposed above a substrate. Trenches are formed in the exposed portions of the low-k dielectric layer. A plurality of process cycles is performed to remove the photoresist layer. Each process cycle includes forming a silicon source layer on surfaces of the trenches of the low-k dielectric layer, and exposing the photoresist layer to an oxygen source to form an Si—O-containing layer on the surfaces of the trenches of the low-k dielectric layer and to remove at least a portion of the photoresist layer.

Patterning of a low-k dielectric layer may be conducted in processing equipment suitable to provide an etch plasma in proximity to a sample for etching. For example, FIG. 6 illustrates a system in which a method of low-k dielectric film patterning is performed, in accordance with an embodiment of the present invention.

Figure 6:
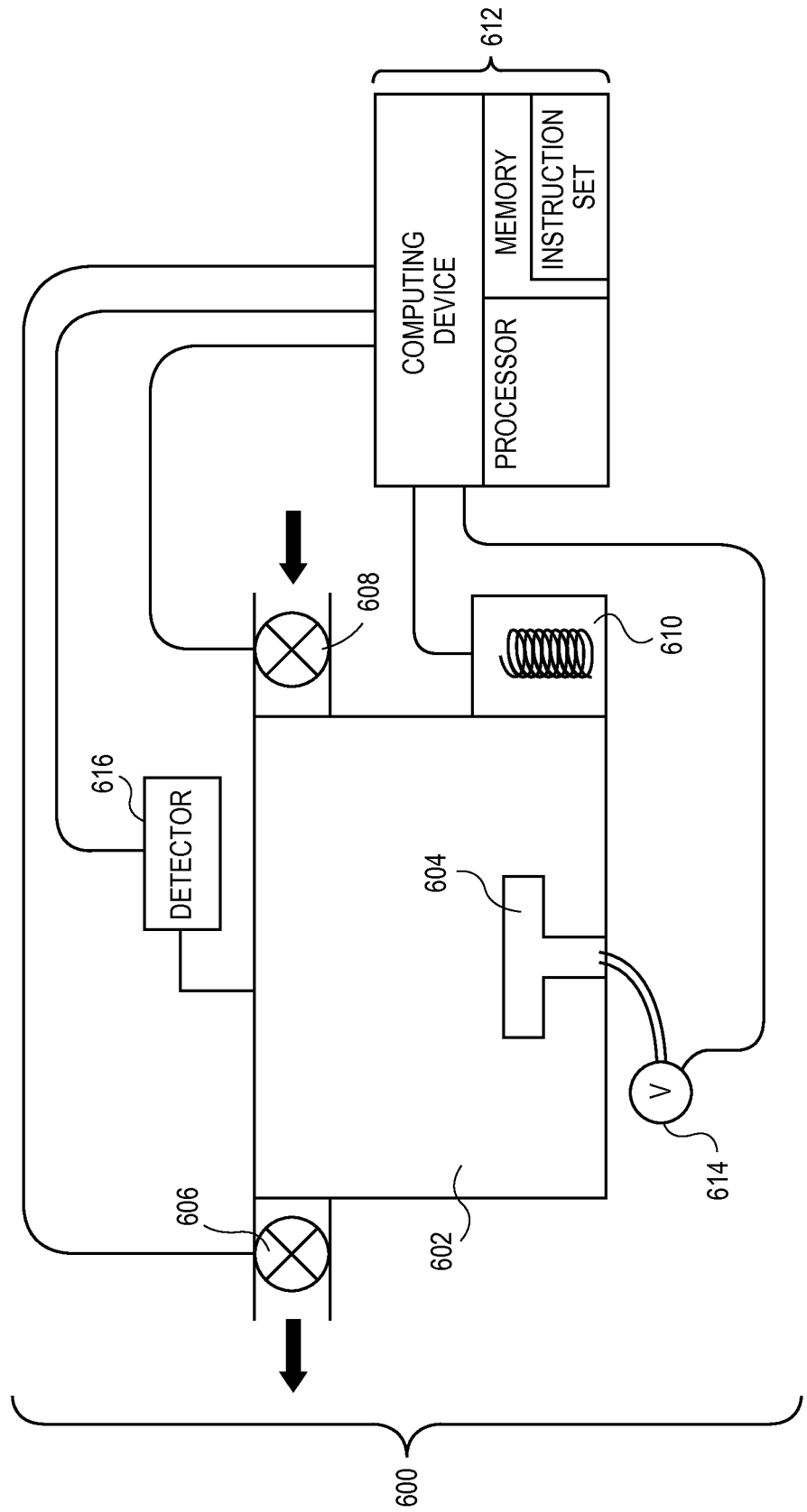
FIG. 6 illustrates a system in which a method of low-k dielectric film patterning is performed, in accordance with an embodiment of the present invention.

Referring to FIG. 6, a system 600 for conducting a plasma etch process includes a chamber 602 equipped with a sample holder 604. An evacuation device 606, a gas inlet device 608 and a plasma ignition device 610 are coupled with chamber 602. A computing device 612 is coupled with plasma ignition device 610. System 600 may additionally include a voltage source 614 coupled with sample holder 604 and a detector 616 coupled with chamber 602. Computing device 612 may also be coupled with evacuation device 606, gas inlet device 608, voltage source 614 and detector 616, as depicted in FIG. 6.

Chamber 602 and sample holder 604 may include a reaction chamber and sample positioning device suitable to contain an ionized gas, i.e. a plasma, and bring a sample in proximity to the ionized gas or charged species ejected there from. Evacuation device 606 may be a device suitable to evacuate and de-pressurize chamber 602. Gas inlet device 608 may be a device suitable to inject a reaction gas into chamber 602. Plasma ignition device 610 may be a device suitable for igniting a plasma derived from the reaction gas injected into chamber 602 by gas inlet device 608. Detection device 616 may be a device suitable to detect an end-point of a processing step. In one embodiment, system 600 includes a chamber 602, a sample holder 604, an evacuation device 606, a gas inlet device 608, a plasma ignition device 610 and a detector 616 similar to, or the same as, those included in an Applied Centura® Enabler dielectric etch system or an Applied Centura® Enabler Producer Etch system.

Thus, methods of removing photoresists from low-k dielectric films have been disclosed. In accordance with an embodiment of the present invention, a method includes forming and patterning a photoresist layer above a low-k dielectric layer, the low-k dielectric layer disposed above a substrate. Trenches are formed in the exposed portions of the low-k dielectric layer. A plurality of process cycles is performed to remove the photoresist layer. Each process cycle includes forming a silicon source layer on surfaces of the trenches of the low-k dielectric layer, and exposing the photoresist layer to an oxygen source to form an Si—O-containing layer on the surfaces of the trenches of the low-k dielectric layer and to remove at least a portion of the photoresist layer. In one embodiment, forming the silicon source layer on surfaces of the trenches of the low-k dielectric layer comprises depositing a silicon-containing compound selected from the group consisting of silicon tetrachloride ($SiCl_4$), dimethylsilane (($CH_3$)$_2SiH_2$), trimethylsilane (($CH_3$)$_3SiH$), N-(trimethylsilyl)dimethylamine (($CH_3$)$_3SiN(CH_2)_2$), and 1,1,1,3,3,3-hexamethyldisilazane (HMDS).

What is claimed is:

1. A method of patterning a low-k dielectric film, the method comprising:
    forming and patterning a photoresist layer above a low-k dielectric layer to form exposed portions of the low-k dielectric layer, the low-k dielectric layer disposed above a substrate;
    forming trenches in the exposed portions of the low-k dielectric layer; and
    performing a plurality of process cycles to remove the photoresist layer, each process cycle comprising:
        forming a silicon source layer on surfaces of the trenches of the low-k dielectric layer; and
        exposing the photoresist layer to an oxygen source to form an Si—O-containing layer on the surfaces of the trenches of the low-k dielectric layer and to remove at least a portion of the photoresist layer.

2. The method of claim 1, wherein forming the silicon source layer on surfaces of the trenches of the low-k dielectric layer comprises depositing a silicon-containing compound selected from the group consisting of silicon tetrachloride ($SiCl_4$), dimethylsilane (($CH_3$)$_2SiH_2$), trimethylsilane (($CH_3$)$_3SiH$), N-(trimethylsilyl)dimethylamine (($CH_3$)$_3SiN(CH_2)_2$), and 1,1,1,3,3,3-hexamethyldisilazane (HMDS).

3. The method of claim 2, wherein depositing the silicon-containing compound comprises forming a covalent bond between the surfaces of the trenches of the low-k dielectric layer and the silicon-containing compound.

4. The method of claim 1, wherein exposing the photoresist layer to the oxygen source comprises exposing the photoresist layer to an oxygen radical source molecular species with a dissociation product comprising an oxygen radical, the oxygen radical source molecular species selected from the group consisting of oxygen ($O_2$), ozone ($O_3$), carbon dioxide ($CO_2$), and water ($H_2O$).

5. The method of claim 1, further comprising:
    subsequent to performing the plurality of process cycles, removing the Si—O-containing layer from the low-k dielectric layer.

6. The method of claim 1, wherein forming trenches in exposed portions of the low-k dielectric layer comprises forming trenches partially or entirely through the low-k dielectric layer.

7. The method of claim 1, wherein the low-k dielectric layer is a porous SiCOH layer having a dielectric constant of less than 2.7.

8. A method of patterning a low-k dielectric film, the method comprising:
    forming and patterning a photoresist layer above a low-k dielectric layer to form exposed portions of the low-k dielectric layer, the low-k dielectric layer disposed above a substrate;
    forming trenches in the exposed portions of the low-k dielectric layer; and
    hydrolyzing surfaces of the trenches of the low-k dielectric layer;
    reacting a silicon source with the hydrolyzed surfaces of the trenches of the low-k dielectric layer; and
    exposing the photoresist layer to an oxygen source to remove the photoresist layer.

9. The method of claim 8, wherein reacting the silicon source with the hydrolyzed surfaces of the trenches of the low-k dielectric layer comprises depositing a silicon-containing compound selected from the group consisting of silicon tetrachloride ($SiCl_4$), dimethylsilane (($CH_3$)$_2SiH_2$), trimethylsilane ((CH$_3$)$_3$SiH), N-(trimethylsilyl)dimethylamine ((CH$_3$)$_3$SiN(CH$_2$)$_2$), and 1,1,1,3,3,3-hexamethyldisilazane (HMDS).

10. The method of claim 9, wherein depositing the silicon-containing compound comprises forming a covalent bond between the surfaces of the trenches of the low-k dielectric layer and the silicon-containing compound.

11. The method of claim 8, wherein exposing the photoresist layer to the oxygen source comprises exposing the photoresist layer to an oxygen radical source molecular species with a dissociation product comprising an oxygen radical, the oxygen radical source molecular species selected from the group consisting of oxygen (O$_2$), ozone (O$_3$), carbon dioxide (CO$_2$), and water (H$_2$O).

12. The method of claim 8, wherein exposing the photoresist layer to the oxygen source comprises converting the reacted silicon source to an Si—O-containing layer on the surfaces of the trenches of the low-k dielectric layer, the method further comprising:

subsequent to removing the photoresist layer, removing the Si—O-containing layer from the low-k dielectric layer.

13. The method of claim 8, wherein forming trenches in exposed portions of the low-k dielectric layer comprises forming trenches partially or entirely through the low-k dielectric layer.

14. The method of claim 8, wherein the low-k dielectric layer is a porous SiCOH layer having a dielectric constant of less than 2.7.

15. A method of patterning a low-k dielectric film, the method comprising:

forming and patterning a photoresist layer above a low-k dielectric layer to form exposed portions of the low-k dielectric layer, the low-k dielectric layer disposed above a substrate;

forming trenches in the exposed portions of the low-k dielectric layer; and performing a plurality of process cycles to remove the photoresist layer, each process cycle comprising:

hydrolyzing surfaces of the trenches of the low-k dielectric layer;

reacting a silicon source with the hydrolyzed surfaces of the trenches of the low-k dielectric layer; and exposing the photoresist layer to an oxygen source to remove at least a portion of the photoresist layer.

16. The method of claim 15, wherein reacting the silicon source with the hydrolyzed surfaces of the trenches of the low-k dielectric layer comprises depositing a silicon-containing compound selected from the group consisting of silicon tetrachloride (SiCl$_4$), dimethylsilane ((CH$_3$)$_2$SiH$_2$), trimethylsilane ((CH$_3$)$_3$SiH), N-(trimethylsilyl)dimethylamine ((CH$_3$)$_3$SiN(CH$_2$)$_2$), and 1,1,1,3,3,3-hexamethyldisilazane (HMDS).

17. The method of claim 16, wherein depositing the silicon-containing compound comprises forming a covalent bond between the surfaces of the trenches of the low-k dielectric layer and the silicon-containing compound.

18. The method of claim 15, wherein exposing the photoresist layer to the oxygen source comprises exposing the photoresist layer to an oxygen radical source molecular species with a dissociation product comprising an oxygen radical, the oxygen radical source molecular species selected from the group consisting of oxygen (O$_2$), ozone (O$_3$), carbon dioxide (CO$_2$), and water (H$_2$O).

19. The method of claim 15, wherein exposing the photoresist layer to the oxygen source comprises converting the reacted silicon source to an Si—O-containing layer on the surfaces of the trenches of the low-k dielectric layer, the method further comprising:

subsequent to performing the plurality of process cycles, removing the Si—O-containing layer from the low-k dielectric layer.

20. The method of claim 15, wherein forming trenches in exposed portions of the low-k dielectric layer comprises forming trenches partially or entirely through the low-k dielectric layer.

\* \* \* \* \*